United States Patent
Osanai et al.

(10) Patent No.: US 9,793,825 B2
(45) Date of Patent: Oct. 17, 2017

(54) POWER CONVERSION DEVICE WITH A VOLTAGE GENERATION PART THAT IS CONFIGURED TO SUPPLY CURRENT TO A SENSE DIODE AND A SENSE RESISTOR IN SELECT SITUATIONS

(71) Applicant: TOYOTA JIDOSHA KABUSHIKI KAISHA, Toyota-shi, Aichi (JP)

(72) Inventors: Yosuke Osanai, Toyota (JP); Ayuki Koishi, Kani (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/911,222

(22) PCT Filed: Sep. 10, 2014

(86) PCT No.: PCT/JP2014/073927
§ 371 (c)(1),
(2) Date: Feb. 9, 2016

(87) PCT Pub. No.: WO2015/064219
PCT Pub. Date: May 7, 2015

(65) Prior Publication Data
US 2016/0233788 A1    Aug. 11, 2016

(30) Foreign Application Priority Data

Oct. 31, 2013  (JP) .................................. 2013-227680

(51) Int. Cl.
*H02M 7/537*    (2006.01)
*H02M 1/32*    (2007.01)
(Continued)

(52) U.S. Cl.
CPC ............. *H02M 7/537* (2013.01); *H02M 1/08* (2013.01); *H02M 1/32* (2013.01);
(Continued)

(58) Field of Classification Search
CPC .. H02M 2001/0009; H02M 1/08; H02M 1/32; H02M 1/38; H02H 7/12; H02H 7/1203
See application file for complete search history.

(56) References Cited

U.S. PATENT DOCUMENTS

2013/0207712 A1* 8/2013 Suzuki ................ H03K 17/165
327/379
2015/0346038 A1* 12/2015 Osanai .................... G01K 7/01
374/178
(Continued)

FOREIGN PATENT DOCUMENTS

JP    2009-254034 A    10/2009
JP    2009-268336 A    11/2009
(Continued)

*Primary Examiner* — Fred E Finch, III
(74) *Attorney, Agent, or Firm* — Oliff PLC (57) ABSTRACT

A power conversion device includes a diode built-in transistor configured to include a transistor configured to be driven by a drive signal input into a gate, a diode configured to be connected in parallel with transistor, and have a forward direction from an emitter to a collector of the transistor, and sense diode configured to detect a current flowing in the diode, and have a cathode connected with the collector of the transistor; voltage generation part configured to generate, in a case where the diode does not conduct electricity, voltage between an anode of the diode and an anode of the sense diode, the voltage having a predetermined or greater difference with respect to a case where the diode conducts electricity; and determination part configured to determine whether the diode conducts electricity, based on the voltage between the anode of the diode and the anode of the sense diode.

7 Claims, 6 Drawing Sheets (51) Int. Cl.
  *H03K 17/082* (2006.01)
  *H03K 17/18* (2006.01)
  *H02M 1/08* (2006.01)
  *H02M 1/00* (2006.01)

(52) U.S. Cl.
  CPC ......... *H03K 17/0828* (2013.01); *H03K 17/18* (2013.01); *H02M 2001/0009* (2013.01); *H03K 2217/0027* (2013.01)

(56) References Cited

U.S. PATENT DOCUMENTS

| | | | |
|---|---|---|---|
| 2016/0011266 A1* | 1/2016 | Osanai | G01R 31/42 324/762.01 |
| 2016/0020763 A1* | 1/2016 | Osanai | H03K 17/042 327/108 |
| 2016/0308524 A1* | 10/2016 | Inoue | H02M 1/08 |

FOREIGN PATENT DOCUMENTS

| | | | |
|---|---|---|---|
| JP | 2012-019550 A | 1/2012 |
| JP | 2014-216932 A | 11/2014 |
| JP | 2015-089051 A | 5/2015 |
| WO | 2014/174901 A1 | 10/2014 |
| WO | 2015/064222 A1 | 5/2015 |

* cited by examiner

POWER CONVERSION DEVICE WITH A VOLTAGE GENERATION PART THAT IS CONFIGURED TO SUPPLY CURRENT TO A SENSE DIODE AND A SENSE RESISTOR IN SELECT SITUATIONS

TECHNICAL FIELD

The disclosures herein generally relate to a semiconductor device that includes a transistor having a diode built in.

BACKGROUND ART

Conventionally, a power conversion device, such as an inverter and a converter, may use a diode built-in transistor that has a transistor and a diode provided on the same substrate.

The diode built-in transistor has an electrode common to the collector electrode of the transistor and the cathode electrode of the diode, and an electrode common to the emitter electrode of the transistor and the anode electrode of the diode. Therefore, when a gate signal is input into the transistor to turn on the transistor, the anode and the cathode of the diode tend to take the same potential, which makes it difficult for the diode to operate in the forward direction. Consequently, gate interference may occur that increases the forward voltage of the diode. Thus, in a case where the diode conducts electricity, if a gate signal is input into the transistor to turn on the transistor, there is a problem that the forward-directional loss of the diode increases.

Thereupon, a technology has been proposed that determines whether the diode conducts electricity in a diode built-in transistor, and if the diode conducts electricity, inhibits the gate signal from being input into the transistor (for example, Patent Document 1). Specifically, the technology has the diode and the transistor provided with sense elements for current detection, and determines whether the diode conducts electricity, based on the direction of a current flowing in a sense resistor connected with the sense elements, namely, whether the voltage between both terminals of the sense resistor takes a positive value or a negative value. This prevents the transistor from turning on when the diode conducts electricity, and hence, it is possible to prevent the forward-directional loss of the diode from increasing.

RELATED-ART DOCUMENTS

Patent Documents

[Patent Document 1] Japanese Laid-open Patent Publication No. 2012-019550

SUMMARY OF THE INVENTION

Problem to be Solved by Invention

In contrast to the diode (referred to as the "main diode", below), a sense diode being the sense element has a smaller size, and has a lower flowing current compared to the main diode. Therefore, the current densities of the main diode and the sense diode may take values close to each other.

However, in general, since the current density of a diode is proportional to the forward voltage, if the main diode and the sense diode take values close to each other, the difference between both forward voltages may become less. Therefore, when the main diode conducts electricity, the voltage between both terminals of the sense resistor may become virtually zero, and hence, the precision may be reduced for determining whether the diode conducts electricity, based on the voltage between both terminals of the sense resistor described above.

Thereupon, in view of the above, it is an object to provide a power conversion device including a diode built-in transistor, that can precisely determine whether the diode conducts electricity in the diode built-in transistor.

Means to Solve the Problem

According to an embodiment, a power conversion device includes a diode built-in transistor configured to include a transistor configured to be driven by a drive signal input into a gate, a diode configured to be connected in parallel with the transistor, and to have a forward direction from an emitter to a collector of the transistor, and a sense diode configured to detect a current flowing in the diode, and to have a cathode connected with the collector of the transistor; a voltage generation part configured to generate, in a case where the diode does not conduct electricity, a voltage between an anode of the diode and an anode of the sense diode, the voltage having a predetermined or greater difference with respect to a case where the diode conducts electricity; and a determination part configured to determine whether the diode conducts electricity, based on the voltage between the anode of the diode and the anode of the sense diode.

Advantage of the Invention

According to an embodiment, it is possible to provide a power conversion device including a diode built-in transistor, that can precisely determine whether the diode conducts electricity in the diode built-in transistor.

MODE FOR CARRYING OUT THE INVENTION

In the following, embodiments will be described with reference to the drawings.

[First Embodiment]

Figure 1:
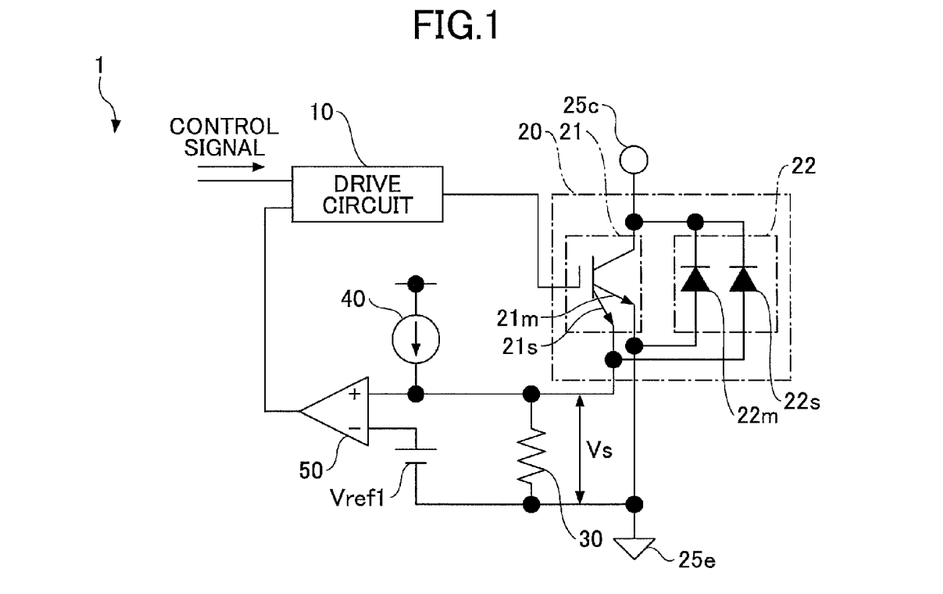
FIG. 1 is a circuit diagram of a semiconductor device 1 included in a power conversion device according to a first embodiment.

FIG. 1 is a circuit diagram of a semiconductor device 1 included in a power conversion device according to the embodiment. Note that the power conversion device according to the embodiment may be, for example, an inverter that converts DC power of a battery into three-phase AC power to supply it to a three-phase AC motor; a boost converter that boosts the voltage of a battery; or the like, in a hybrid vehicle, an electric vehicle, or the like. Also, the semiconductor device 1 may be used as a power switching element that is built in the inverter or the boost converter.

The semiconductor device 1 includes a drive circuit 10, a diode built-in transistor 20, a sense resistor 30, a current source 40, a comparator 50, and a reference voltage Vref1.

The drive circuit 10 is configured to be capable of outputting a drive signal to gates of a transistor 21m and a sense transistor 21s included in the diode built-in transistor 20, which will be described later, based on a control signal from a control apparatus that controls the power conversion device (simply referred to as the "control apparatus", below). For example, if the power conversion device is a boost converter, the boost converter may output a PWM (Pulse Width Modulation) signal that represents a duty cycle to boost the voltage to a desired voltage, to the gates of the transistor 21m and the sense transistor 21s as the drive signal. Also, the drive circuit 10 is configured to receive as input a determination signal from the comparator 50, which will be described later, and to be capable of restricting the output of the drive signal, based on the determination signal. Restricting the output of the drive signal, based on the determination signal from the comparator 50, will be described in detail later.

The diode built-in transistor 20 includes a transistor part 21 and a diode part 22.

The transistor part 21 includes the transistor 21m and the sense transistor 21s. The transistor 21m is a switching element that is connected with a power source or a load (not illustrated), and executes switching operations to satisfy a predetermined function of the power conversion device (for example, a boost function in a boost converter), based on the drive signal from the drive circuit 10. The sense transistor 21s is a switching element that is provided for current detection of the transistor 21m. Note that the transistor 21m and the sense transistor 21s may be, for example, IGBTs (Insulated Gate Bipolar Transistors) that are configured to have a trench gate structure, and their gates are formed to be a common gate. Therefore, the sense transistor 21s executes substantially the same switching operation as the transistor 21m (for example, if the transistor 21m turns on, the sense transistor 21s also turns on).

The gates of the transistor 21m and the sense transistor 21s are connected with the drive circuit 10. Also, the transistor 21m is connected in parallel with a diode 22m, and the sense transistor 21s is connected in parallel with a sense diode 22s. Specifically, the collectors of the transistor 21m and the sense transistor 21s are formed in common, and are connected with the cathodes of the diode 22m and the sense diode 22s. Also, the emitter of the transistor 21m is connected with the anode of the diode 22m, and the emitter of the sense transistor 21s is connected with the anode of the sense diode 22s.

Also, the collector of the transistor 21m is connected with a load or a power source (not illustrated) via a collector terminal 25c of the semiconductor device 1. Also, the emitter of the transistor 21m is connected with a load or a power source (not illustrated) via an emitter terminal 25e of the semiconductor device 1. The diode part 22 includes the diode 22m and the sense diode 22s.

The diode 22m is a rectifier for commutation of a current flowing in the transistor 21m. The sense diode 22s is a rectifier provided for current detection of the diode 22m.

The cathodes of the diode 22m and the sense diode 22s are connected with the collector of the transistor 21m. Also, the anode of the diode 22m is connected with the emitter of the transistor 21m. Also, the anode of the sense diode 22s is connected with the emitter of the sense transistor 21s.

The sense resistor 30 is provided to detect the electrical conduction direction of the diode built-in transistor 20, namely, whether a current flows in (from the collector to the emitter of) the transistor 21m, a current flows in the diode 22m, or no current flows in either. One terminal of the sense resistor 30 is connected with the emitter of the sense transistor 21s and the anode of the sense diode 22s. Also, the other terminal of the sense resistor 30 is connected with the emitter of the transistor 21m and the anode of the diode 22m. A method of detecting the electrical conduction direction of the diode built-in transistor 20 by using the sense resistor 30, will be described in detail later.

The current source 40 can supply a predetermined current, and is configured to be capable of supplying the predetermined current to one of the sense resistor 30 and (the anode of) the sense diode 22s, to both of which the current source 40 is branched off and connected. Specific operations of the current source 40 will be described later.

The comparator 50 receives, as input, the voltage between both terminals of the sense resistor 30 with respect to the potential of the emitter terminal 25e (the emitter of the transistor 21m or the anode of the diode 22m) as the reference (simply referred to as the "voltage between both terminals of the sense resistor 30", below), and the reference voltage Vref1, and compares the two. Then, depending on a comparison result, the comparator 50 determines whether the diode 22m of the diode built-in transistor 20 conducts electricity. Also, depending on the comparison result, the comparator 50 outputs a determination signal that represents whether the diode 22m of the diode built-in transistor 20 conducts electricity, to the drive circuit 10. Specifically, if determining that the diode 22m does not conduct electricity, the comparator 50 outputs a determination signal (a permission signal), that permits the drive signal to be input into the gate of the transistor 21m, to the drive circuit 10. Also, if determining that the diode 22m conducts electricity, the comparator 50 outputs a determination signal (an inhibition signal), that inhibits (at least an on signal of) the drive signal from being input into the gate of the transistor 21m, to the drive circuit 10. Specific operations will be described later.

The reference voltage Vref1 is the reference for comparison with the voltage between both terminals of the sense resistor 30 at the comparator 50. The reference voltage Vref1 (a determination method) will be described in detail later.

Next, specific operations of the semiconductor device 1 will be described according to the embodiment.

Figure 2A:
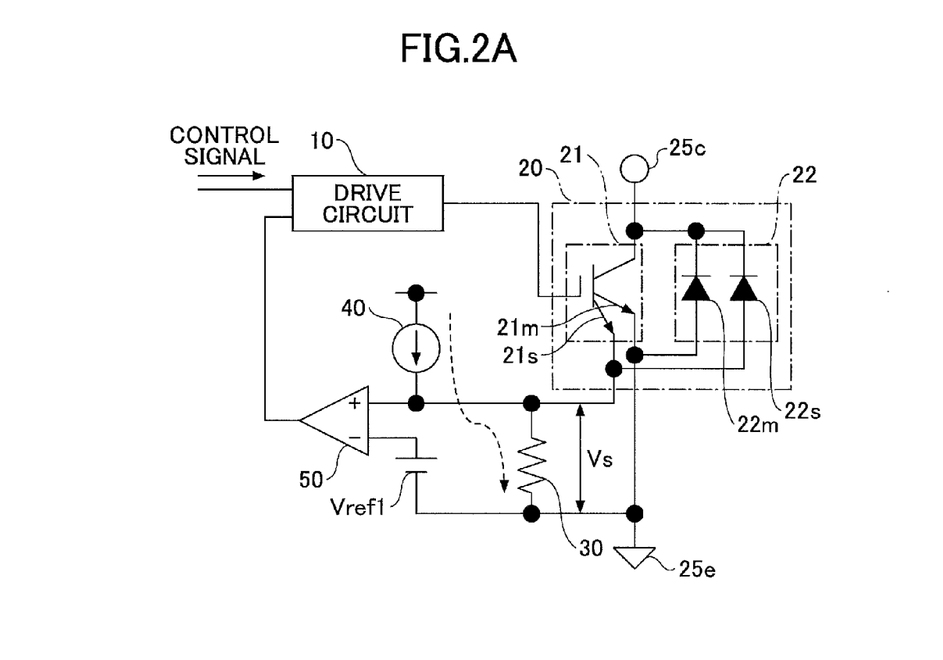
FIG. 2A is a diagram that illustrates an operation of the semiconductor device 1 according to the first embodiment.
Figure 2B:
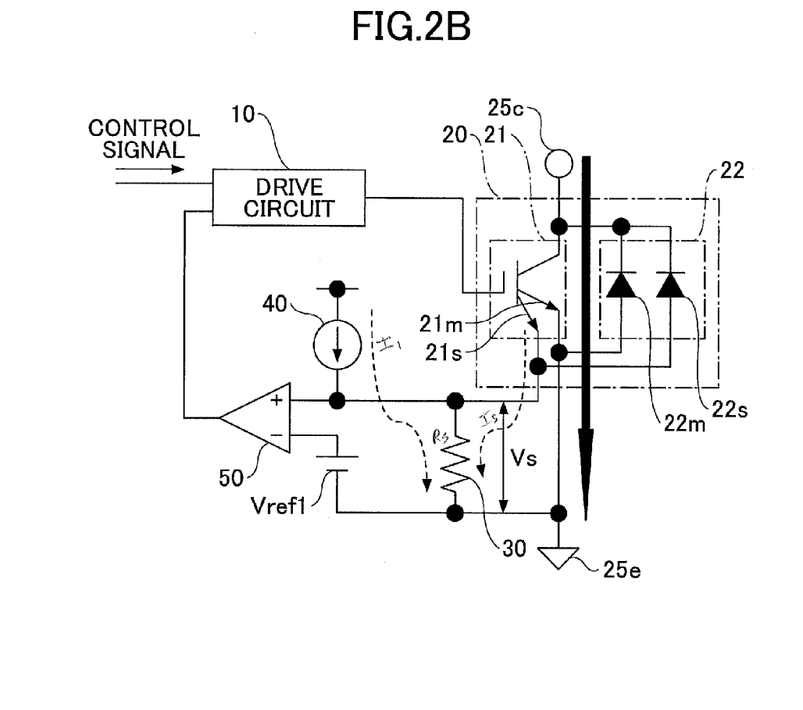
FIG. 2B is a diagram that illustrates an operation of the semiconductor device 1 according to the first embodiment.
Figure 2C:
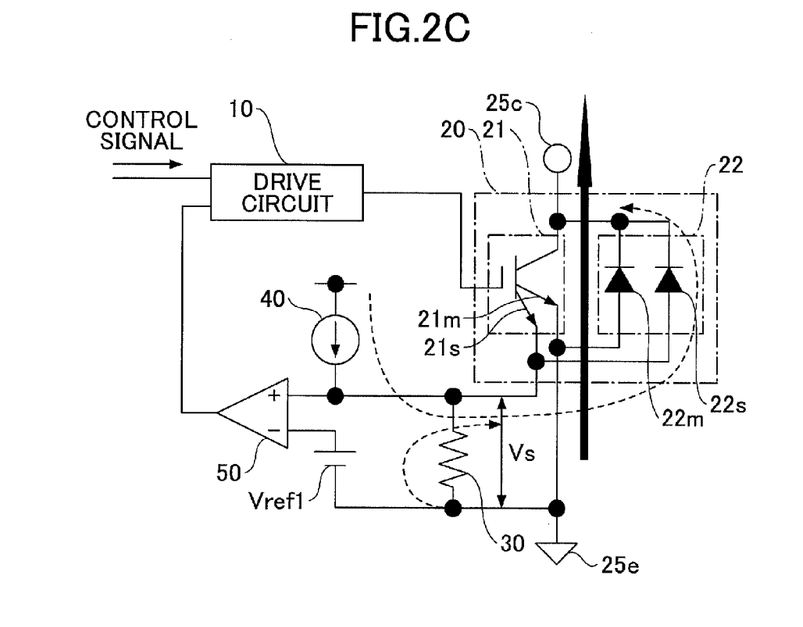
FIG. 2C is a diagram that illustrates an operation of the semiconductor device 1 according to the first embodiment.

FIGS. 2A to 2C are diagrams that illustrate operations of the semiconductor device 1 according to the embodiment. FIG. 2A is a diagram that illustrates an operation of the semiconductor device 1 in a case where no current flows in either the transistor 21m or the diode 22m. FIG. 2B is a diagram that illustrates an operation of the semiconductor device 1 in a case where a current flows in the transistor 21m (and a current does not flow in the diode 22m). FIG. 2C is a diagram that illustrates an operation of the semiconductor device 1 in a case where a current flows in the diode 22m (and a current does not flow in the transistor 21m).

Here, several symbols are defined for the sake of simplicity below. I1 represents a current supplied from the current source 40. Also, Is represents a current flowing from the emitter of the sense transistor 21s to the sense resistor 30. Also, Rs represents the resistance value of the sense resistor 30, and Vs represents the voltage between both terminals. Also, VFm and VFs represent the forward voltages of the diode 22m and the sense diode 22s, respectively.

Referring to FIG. 2A, an on signal (a high signal) is not input from the drive circuit 10 to the gate of the transistor 21m (the sense transistor 21s), and no current flows between the collector and the emitter of the transistor 21m. Also, the diode 22m does not conduct electricity. In other words, the potential of the collector of the transistor 21m (the collector terminal 25c) is higher than the potential of the emitter (the emitter terminal 25e). Therefore, the current I1 supplied from the current source 40 does not flow in the sense diode 22, but flows in the sense resistor 30 (a dotted-line arrow in the figure). Therefore, the voltage Vs between both terminals of the sense resistor 30 is Vs=I1×Rs.

Also, referring to FIG. 2B, an on signal is input from the drive circuit 10 to the gate of the transistor 21m, and a current flows between the collector and the emitter of the transistor 21m (from the collector terminal 25c to the emitter terminal 25e) (a thick arrow in the figure). Also, the on signal is input from the drive circuit 10 to the gate of the sense transistor 21s that is common with the gate of the transistor 21m, and a current flows between the collector and the emitter of the sense transistor 21s. This makes the current Is flow from the emitter of the sense transistor 21s to the sense resistor 30 (a dotted-line arrow in the figure). At the same time, the current I1 supplied from the current source 40 flows in the sense resistor 30 (a dotted-line arrow in the figure). Therefore, the voltage Vs between both terminals of the sense resistor 30 is Vs=(Is+I1)×Rs.

Also, referring to FIG. 2C, the diode 22m conducts electricity, and a current flows from the emitter terminal 25e to the collector terminal 25c (a thick arrow in the figure). In this case, the potential of the collector of the transistor 21m (the collector terminal 25c) is lower than the potential of the emitter of the transistor 21m (the emitter terminal 25e). Therefore, a current flows from the sense resistor 30 to the sense diode 22s (a dotted-line arrow in the figure). Also, the current I1 supplied from the current source 40 flows in the sense diode 22s (a dotted-line arrow in the figure). At this moment, the voltage Vs between both terminals of the sense resistor 30 is clamped by the forward voltages VFm and VFs of the diode 22m and the sense diode 22s, to make Vs=−VFm+VFs. Note that since a comparatively high current flows in the diode 22m, the size is set to be large to a certain extent depending on the current. Also, since the sense diode 22s is for current detection in which a comparatively low current flows, the size is set to be small to a certain extent. Therefore, the current densities of the diode 22m and the sense diode 22s may take values comparatively close to each other. Also, since the forward voltage of a diode is proportional to the current density in general, the forward voltage VFm of the diode 22m and the forward voltage VFs of the sense diode 22s take values close to each other in this case. Therefore, in a case where the diode 22m conducts electricity, the voltage Vs between both terminals of the sense resistor 30, which is Vs=−VFm+VFs, may be a very small value (virtually zero).

Note that if the diode 22m does not conduct electricity, the current I1 flowing from the current source 40 to the sense resistor 30 can make the voltage between both terminals of the sense resistor 30 greater in the case where the diode 22m does not conduct electricity. Therefore, by the current source 40, a difference can be made clearer between a voltage Vs between both terminals of the sense resistor 30 in a case where the diode 22m conducts electricity, and a voltage Vs between both terminals of the sense resistor 30 in a case where the diode 22m does not conduct electricity. In other words, based on the voltage between both terminals of the sense resistor 30, it is possible to clearly determine the electrical conduction direction of the diode built-in transistor 20 (or whether the diode 22m conducts electricity).

Next, a method of determining the electrical conduction direction of the diode built-in transistor 20, by the comparator 50 based on the voltage Vs between both terminals of the sense resistor 30, will be described.

As described above, the comparator 50 determines the electrical conduction direction of the diode built-in transistor 20, namely, whether the diode 22m conducts electricity, depending on a comparison result between the voltage Vs between both terminals of the sense resistor 30, and the reference voltage Vref1.

Note that as described above, in a case where the diode 22m does not conduct electricity, the voltage Vs between both terminals of the sense resistor 30 is Vs=I1×Rs if the transistor 21m also does not conduct electricity, or Vs=(Is+I1)×Rs if the transistor 21m conducts electricity. Also, in a case where the diode 22m conducts electricity, the voltage Vs between both terminals of the sense resistor 30 is Vs=−VFm+VFs. Therefore, by determining the reference voltage Vref1 to satisfy −VFm+VFs<Vref1<I1×Rs, the comparator 50 can determine the electrical conduction direction of the diode built-in transistor 20, by comparing the voltage Vs between both terminals of the sense resistor 30, with the reference voltage Vref1.

Also, by appropriately setting the current I1 supplied from the current source 40, a difference can be made great between a voltage Vs=−VFm+VFs between both terminals of the sense resistor 30 in a case where the diode 22m conducts electricity, and a voltage Vs=I1×Rs between both terminals of the sense resistor 30 in a case where the diode 22m does not conduct electricity as described above. Therefore, the difference can be made clear between the voltage Vs=−VFm+VFs between both terminals of the sense resistor 30 in a case where the diode 22m conducts electricity, and the voltage Vs=I1×Rs between both terminals of the sense resistor 30 in a case where the diode 22m does not conduct electricity. Therefore, the comparator 50 can clearly determine the electrical conduction direction of the diode built-in transistor 20, namely, whether the diode 22m conducts electricity, and the determination precision can be increased.

Next, the output restriction of the drive signal based on the determination signal from the comparator 50, will be described.

If determining that the diode 22m does not conduct electricity, the comparator 50 outputs a determination signal (a permission signal), that permits the drive signal to be input into the gate of the transistor 21m, to the drive circuit 10. Also, if determining that the diode 22m conducts electricity, the comparator 50 outputs a determination signal (an inhibition signal), that inhibits (at least an on signal of) the drive signal from being input into the gate of the transistor 21m, to the drive circuit 10.

In response to receiving a permission signal as the determination signal from the comparator 50, the drive circuit 10 outputs a drive signal based on a control signal from the control apparatus, to the gate of the transistor 21m. Also, in response to receiving an inhibition signal as the determination signal from the comparator 50, the drive circuit 10 restricts outputting the drive signal. For example, the drive circuit 10 may restrict outputting both an on signal (a high signal) to turn on the transistor 21*m*, and an off signal (a low signal) to turn off, or may restrict outputting an on signal (high signal) to turn on the transistor 21*m*. Thus, in a case where the diode 22*m* conducts electricity, the transistor 21*m* is not turned on, and hence, the forward-directional loss of the diode 22*m* by gate interference can be reduced. Especially, the determination precision is increased to determine whether the diode 22*m* conducts electricity at the comparator 50 by the current I1 from the current source 40 as described above, and hence, the forward-directional loss of the diode 22*m* by the gate interference can be reduced more appropriately.

Note that a specific configuration to restrict the output of the drive signal by a determination signal from the comparator 50 (an inhibition signal) may be configured to have, for example, a transistor to ground the output part of the drive circuit 10, that is turned on in response to receiving as input an inhibition signal as an on signal (a high signal) at the gate of the transistor. This grounds the output part of the drive circuit 10, and the drive circuit 10 cannot output an on signal (a high signal).

[Second Embodiment]

Next, a second embodiment will be described.

Figure 3:
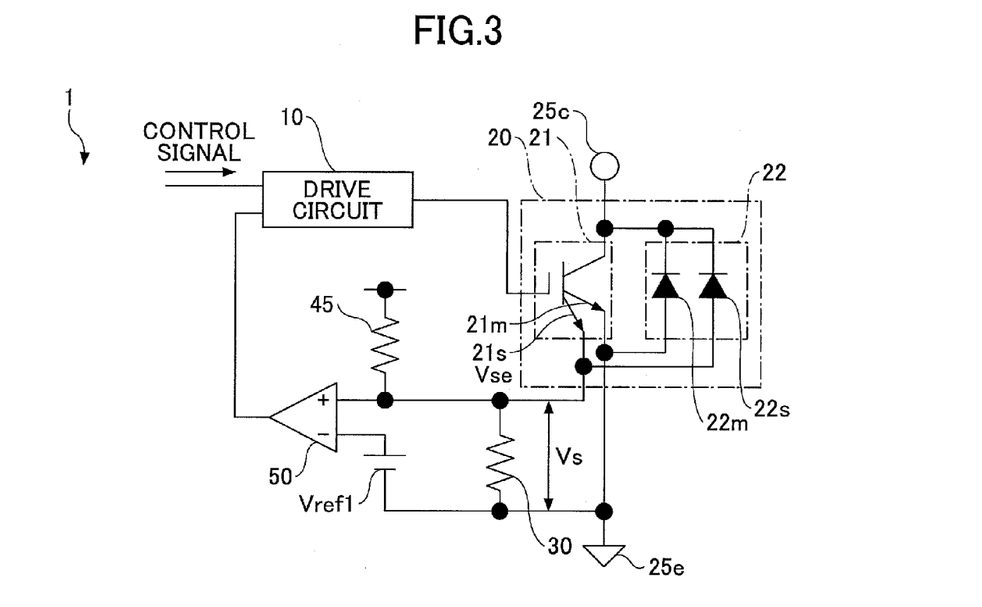
FIG. 3 is a circuit diagram of a semiconductor device 1 included in a power conversion device according to a second embodiment.

A semiconductor device 1 included in a power conversion device according to the embodiment differs from the first embodiment in that a pull-up resistor 45 is provided instead of the current source 40. In the following, the same elements as in the first embodiment are assigned the same numerical codes, and different parts will be mainly described.

FIG. 3 is a circuit diagram of a semiconductor device 1 included in the power conversion device according to the embodiment. Here, the pull-up resistor 45 will be described that is a different part from FIG. 1 in the first embodiment.

The pull-up resistor 45 is branched off and connected to the sense resistor 30 and (the anode of) the sense diode 22*s*. Also, the pull-up resistor 45 is configured, with respect to the potential of one terminal of the pull-up resistor 45 on the side of the sense resistor 30, to have the potential of the other terminal higher. Thus, similar to the current source in the first embodiment, it is possible to supply a current to one of the sense resistor 30 and (the anode of) the sense diode 22*s*. Note that in the following, for the sake of simplicity, Rp represents the resistance value of the pull-up resistor 45, Vp represents the voltage between both terminals of the pull-up resistor 45 with respect to the one terminal on the sense resistor side as the reference (simply referred to as the "voltage between both terminals of the pull-up resistor 45", below), and Ip (=Vp/Rp) represents a current that flows from the pull-up resistor 45 to the sense resistor or the sense diode 22*s*. Specifically, in a case where the diode 22*m* does not conduct electricity, the current Ip flows from the pull-up resistor 45 to the sense resistor 30, or in a case where the diode 22*m* conducts electricity, the current Ip flows from the pull-up resistor 45 to (the anode of) the diode 22*m*. In the following, this will be described more specifically.

In a case where both the transistor 21*m* and the diode 22*m* do not conduct electricity, the potential of the collector of the transistor 21*m* (the collector terminal 25*c*) is higher than the potential of the emitter (the emitter terminal 25*e*). Therefore, a current does not flow from the pull-up resistor 45 to the sense diode 22*s*, but the current Ip flows from the pull-up resistor 45 to the sense resistor 30. At this moment, the voltage Vs between both terminals of the sense resistor 30 is Vs=Rs×Ip=(Rs/Rp)×Vp.

Also, in a case where the transistor 21*m* conducts electricity, an on signal is input from the drive circuit 10 to the gate of the transistor 21*m*, and a current flows between the collector and the emitter of the transistor 21*m* (from the collector terminal 25*c* to the emitter terminal 25*e*). Also, the on signal is input from the drive circuit 10 to the gate of the sense transistor 21*s* that is common with the gate of the transistor 21*m*, and a current flows between the collector and the emitter of the sense transistor 21*s*. This makes the current Is flow from the emitter of the sense transistor 21*s* to the sense resistor 30. At the same time, the current Ip supplied from the pull-up resistor 45 flows in the sense resistor 30. Therefore, the voltage Vs between both terminals of the sense resistor 30 is Vs=(Is+Ip)×Rs=Is×Rs+(Rs/Rp)×Vp.

Also, in a case where the diode 22*m* conducts electricity, the potential of the collector of the transistor 21*m* (the collector terminal 25*c*) is lower than the potential of the emitter of the transistor 21*m* (the emitter terminal 25*e*). Therefore, a current flows from the sense resistor 30 to the sense diode 22*s*. Also, the current Ip supplied from the pull-up resistor 45 flows in the sense diode 22*s*. At this moment, the voltage Vs between both terminals of the sense resistor 30 is clamped by the forward voltages VFm and VFs of the diode 22*m* and the sense diode 22*s*, to make Vs=−VFm+VFs.

In this way, similar to the first embodiment, in a case where the diode 22*m* does not conduct electricity, the current I1 flowing from the pull-up resistor 45 to the sense resistor 30 can make the voltage between both terminals of the sense resistor 30 greater in the case where the diode 22*m* does not conduct electricity. Therefore, by the pull-up resistor 45, a difference can be made clearer between a voltage Vs between both terminals of the sense resistor 30 in a case where the diode 22*m* conducts electricity, and a voltage Vs between both terminals of the sense resistor 30 in a case where the diode 22*m* does not conduct electricity. In other words, based on the voltage between both terminals of the sense resistor 30, it is possible to clearly determine the electrical conduction direction of the diode built-in transistor 20 (or whether the diode 22*m* conducts electricity).

Also, a method of determining the electrical conduction direction of the diode built-in transistor 20 by the comparator 50 based on the voltage Vs between both terminals of the sense resistor 30, is similar to the first embodiment, and the description is omitted. Similar to the first embodiment, by determining the reference voltage Vref1, the comparator 50 can precisely determine whether the diode 22*m* conducts electricity, based on the reference voltage Vref1. Note that the condition to be satisfied for the reference voltage Vref1 in the embodiment is about the current Ip (=Vp/Rp) of the pull-up resistor 45 that replaces the current I1 of the current source 40 in the first embodiment.

Also, the output restriction of the drive signal based on the determination signal from the comparator 50 is similar to the first embodiment, which results in substantially the same operations and effects. Therefore, the description is omitted.

[Third Embodiment]

Next, a third embodiment will be described.

Figure 4:
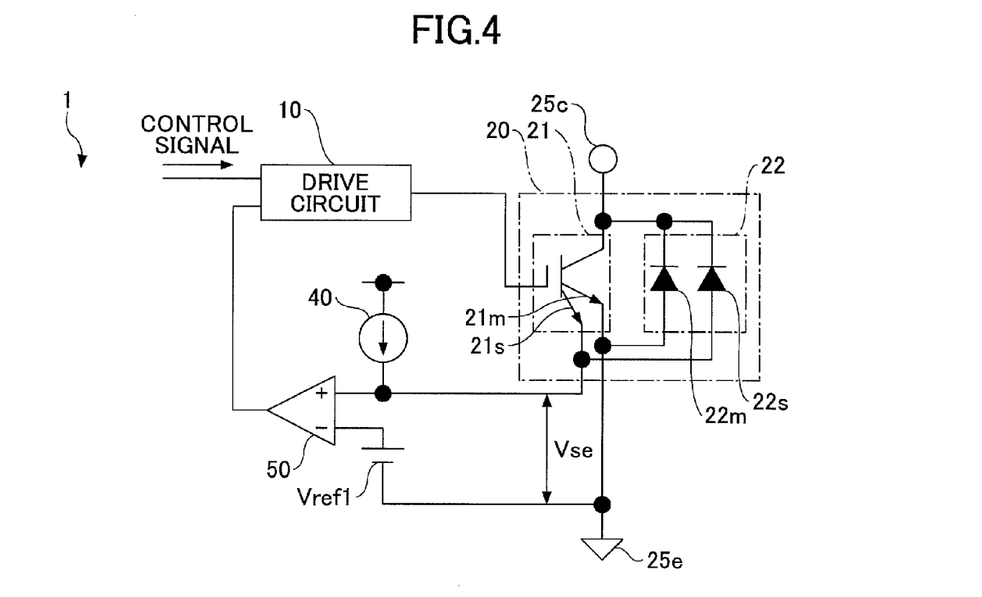
FIG. 4 is a circuit diagram of a semiconductor device 1 included in a power conversion device according to a third embodiment.

A semiconductor device 1 included in a power conversion device according to the embodiment mainly differs from the first embodiment that the sense resistor 30 is not provided. In the following, the same elements as in the first embodiment are assigned the same numerical codes, and different parts will be mainly described.

FIG. 4 is a circuit diagram of the semiconductor device 1 included in the power conversion device according to the embodiment.

The semiconductor device 1 includes a drive circuit 10, a diode built-in transistor 20, a current source 40, a comparator 50, and a reference voltage Vref1. The current source 40 and the comparator 50 will be described that are different from the first embodiment.

The current source 40 can supply a predetermined current, and is configured to be capable of supplying the predetermined current to (the anode of) the sense diode 22s, to which the current source 40 is connected. Also, as will be described later, the current source 40 is configured to be capable of having the sense diode 22s conduct electricity in a case where the transistor 21m conducts electricity. Specific operations of the current source 40 will be described later.

The comparator 50 receives, as input, the voltage (referred to as the "sense emitter voltage", below) of the emitter of the sense transistor 21s (the anode of the sense diode 22s) with respect to the emitter of the transistor 21m (the anode of the diode 22m), and the reference voltage Vref1. Then, the comparator 50 compares the sense emitter voltage with the reference voltage Vref1, and depending on a comparison result, determines whether the diode 22m of the diode built-in transistor 20 conducts electricity. Also, depending on the comparison result, the comparator 50 outputs a determination signal that represents whether the diode 22m of the diode built-in transistor 20 conducts electricity, to the drive circuit 10. Specifically, if determining that the diode 22m does not conduct electricity, the comparator 50 outputs a determination signal (a permission signal), that permits the drive signal to be input into the gate of the transistor 21m, to the drive circuit 10. Also, if determining that the diode 22m conducts electricity, the comparator 50 outputs a determination signal (an inhibition signal), that inhibits (at least an on signal of) the drive signal from being input into the gate of the transistor 21m, to the drive circuit 10.

Next, specific operations of the semiconductor device 1 will be described according to the embodiment.

Figure 5A:
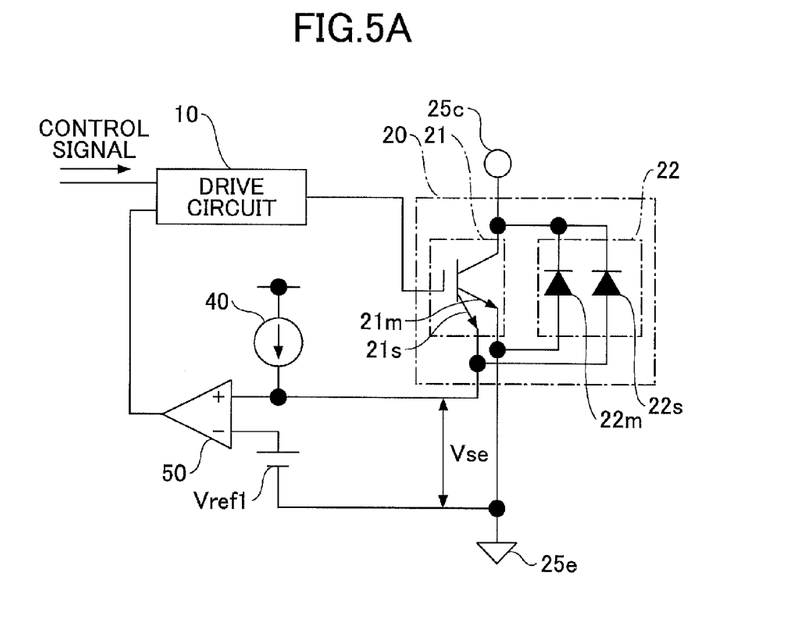
FIG. 5A is a diagram that illustrates an operation of the semiconductor device 1 according to the third embodiment.
Figure 5B:
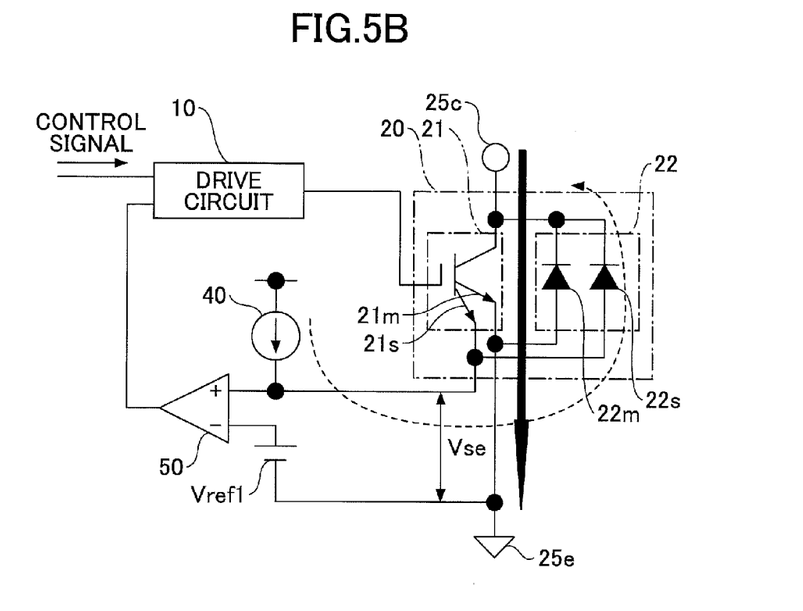
FIG. 5B is a diagram that illustrates an operation of the semiconductor device 1 according to the third embodiment.
Figure 5C:
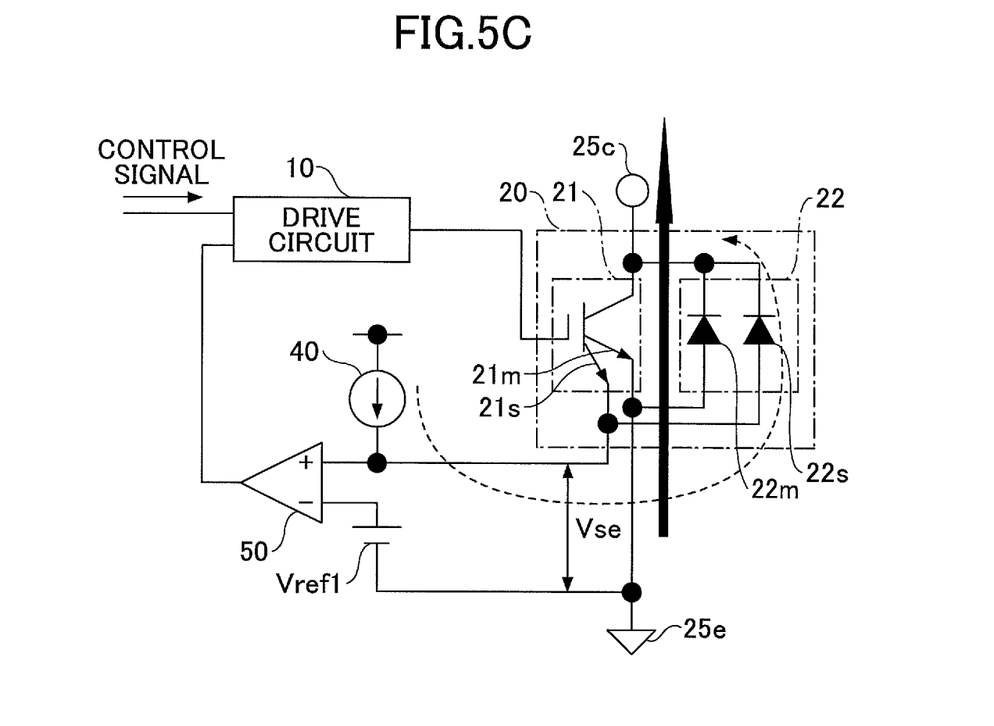
FIG. 5C is a diagram that illustrates an operation of the semiconductor device 1 according to the third embodiment.

FIGS. 5A to 5C are diagrams that illustrate operations of the semiconductor device 1 according to the first embodiment. FIG. 5A is a diagram that illustrates an operation of the semiconductor device 1 in a case where no current flows in either the transistor 21m or the diode 22m. FIG. 5B is a diagram that illustrates an operation of the semiconductor device 1 in a case where a current flows in the transistor 21m (and a current does not flow in the diode 22m). FIG. 5C is a diagram that illustrates an operation of the semiconductor device 1 in a case where a current flows in the diode 22m (and a current does not flow in the transistor 21m). Here, several symbols are defined for the sake of simplicity below. I1 represents a current supplied from the current source 40, and V1 represents the voltage of one terminal on the upstream side of the current source 40 (referred to as the "voltage of the current source 40", below) with respect to the emitter of the transistor 21m (the anode of the diode 22m). Also, Vse represents the sense emitter voltage. Also, VFm and VFs represent the forward voltages of the diode 22m and the sense diode 22s, respectively. Also, Von represents the voltage between the collector and the emitter of the transistor 21m in a case where the transistor 21m conducts electricity (referred to as the "on voltage of the transistor 21m", below).

Referring to FIG. 5A, an on signal (a high signal) is not input from the drive circuit to the gate of the transistor 21m (the sense transistor 21s), and no current flows between the collector and the emitter of the transistor 21m. Also, the diode 22m does not conduct electricity. In other words, the potential of the collector of the transistor 21m (the collector terminal 25c) is higher than the potential of the emitter (the emitter terminal 25e). Therefore, a current does not flow from the current source 40 to the sense diode 22s. Therefore, the sense emitter voltage Vse is Vse=V1.

Also, referring to FIG. 5B, an on signal is input from the drive circuit 10 to the gate of the transistor 21m, and a current flows between the collector and the emitter of the transistor 21m (from the collector terminal 25c to the emitter terminal 25e)(a thick arrow in the figure). Thus, the potential of the collector of the transistor 21m (the collector terminal 25c) is reduced compared to a potential before the transistor 21m turns on. Here, the voltage V1 of the current source 40 may be set so that the difference between the voltage V1 of the current source 40 and the on voltage Von of the transistor 21m is greater than or equal to the forward voltage VFs of the sense diode 22s. This makes the current I1 supplied from the current source 40 flow between the collector and the emitter of the transistor 21m via the sense diode 22s (a dotted-line arrow in the figure). Therefore, the sense emitter voltage Vse is Vse=Von+VFs (≤V1).

Also, referring to FIG. 5C, the diode 22m conducts electricity, and a current flows from the emitter terminal 25e to the collector terminal 25c (a thick arrow in the figure). In this case, the potential of the collector of the transistor 21m (the collector terminal 25c) is lower than the potential of the emitter of the transistor 21m (the emitter terminal 25e). Therefore, the current I1 supplied from the current source 40 flows in the sense diode 22s (a dotted-line arrow in the figure). At this moment, the sense emitter voltage Vse is clamped by the forward voltages VFm and VFs of the diode 22m and the sense diode 22s, to make Vse=−VFm+VFs.

Here, a difference ΔVse of the sense emitter voltage Vse between a case where the diode 22m does not conduct electricity and a case where the diode 22m conducts electricity, is ΔVse=Von+VFm, with which it is possible to clearly determine whether the diode 22m conducts electricity. In other words, based on the sense emitter voltage Vse, the electrical conduction direction of the diode. built-in transistor 20 (whether the diode 22m conducts electricity) can be determined. In this way, by generating the sense emitter voltage Vse=Von+VFs by (the voltage V1 of) the current source 40 in a case where the transistor 21m conducts electricity, it is possible to clearly determine the electrical conduction direction of the diode built-in transistor 20 (or whether the diode 22m conducts electricity), based on the sense emitter voltage Vse.

Next, a method of determining the electrical conduction direction of the diode built-in transistor 20, by the comparator 50 based on the sense emitter voltage Vse.

As described above, the comparator 50 determines the electrical conduction direction of the diode built-in transistor 20, namely, whether the diode 22m conducts electricity, depending on a comparison result between the sense emitter voltage Vse and the reference voltage Vref1.

Note that as described above, in a case where the diode 22m does not conduct electricity, the sense emitter voltage Vse is Vse=V1 if the transistor 21m also does not conduct electricity, or Vs=Von+VFs (≤V1) if the transistor 21m conducts electricity. Also, the sense emitter voltage Vse is Vse=−VFm+VFs in a case where the diode 22m conducts electricity. Therefore, by determining the reference voltage Vref1 to satisfy −VFm+VFs<Vref1<Von+VFs, the comparator 50 can determine the electrical conduction direction of the diode built-in transistor 20, by comparing the sense emitter voltage Vse with the reference voltage Vref1.

Also, as described above, by generating the sense emitter voltage Vse=Von+VFs by (the voltage V1 of) the current source 40 in a case where the transistor 21m conducts electricity, it is possible to generate a clearly distinctive difference on the sense emitter voltage Vse between a case where the diode 22m conducts electricity, and a case where the diode 22m does not conduct electricity. Therefore, the comparator 50 can clearly determine the electrical conduction direction of the diode built-in transistor 20, namely, whether the diode 22m conducts electricity, based on the sense emitter voltage Vse, and the determination precision can be increased.

Also, the output restriction of the drive signal based on the determination signal from the comparator 50, is similar to the first embodiment, which results in substantially the same operations and effects. Therefore, the description is omitted.

Note that although the current source 40 is used in the embodiment, a pull-up resistor may be used instead of the current source 40 as in the second embodiment.

[Fourth Embodiment]

Next, a fourth embodiment will be described.

Figure 6:
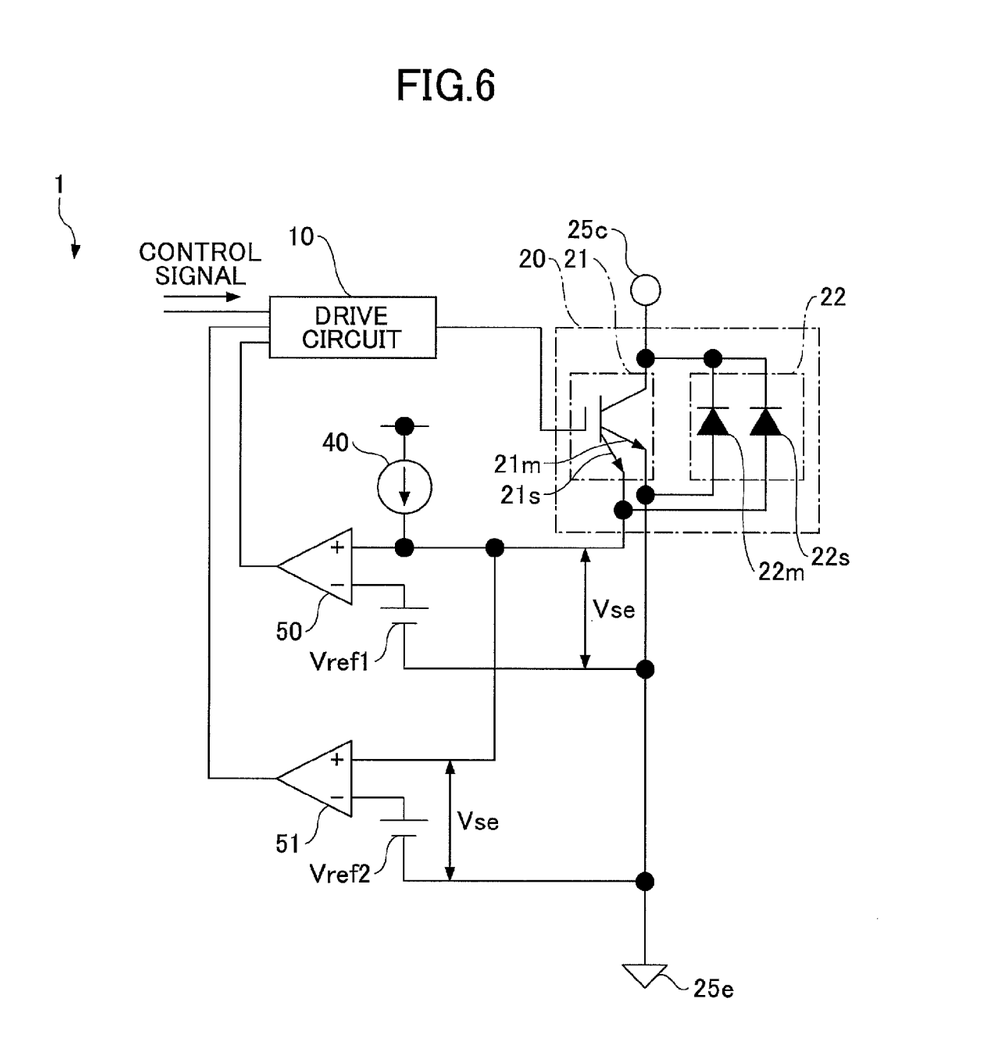
FIG. 6 is a circuit diagram of a semiconductor device 1 included in a power conversion device according to a fourth embodiment.

The embodiment differs from the third embodiment that a comparator is added to determine whether an abnormal current flows in the transistor 21m, based on the sense emitter voltage Vse. In the following, the same elements as in the third embodiment are assigned the same numerical codes, and different parts will be mainly described.

FIG. 6 is a circuit diagram of a semiconductor device 1 included in a power conversion device according to the embodiment.

The semiconductor device 1 includes a drive circuit 10, a diode built-in transistor 20, a current source 40, a comparator 50, a reference voltage Vref1, a comparator for fault detection 51, and a reference voltage for fault detection Vref2. Here, the drive circuit 10, the comparator for fault detection 51, and the reference voltage for fault detection Vref2 will be described that are different from the third embodiment.

In addition to the determination signal from the comparator 50 to determine the electrical conduction direction of the diode built-in transistor 20, the drive circuit 10 receives as input a determination signal from the comparator for fault detection 51 to determine whether an abnormal current flows in the diode built-in transistor 20. Further, the drive circuit 10 is configured to be capable of restricting the output of the drive signal, based on these determination signals. As will be described later in detail, the drive circuit 10 restricts the output of the drive signal, in response to receiving as input an inhibition signal that inhibits (at least an on signal of) one of drive signals from the comparator 50 and the comparator for fault detection 51, from being input into the gate of the transistor 21m.

The comparator for fault detection 51 receives, as input, the voltage (the sense emitter voltage Vse) between the emitter of the sense transistor 21s (the anode of the sense diode 22s) and the emitter of the transistor 21m (the anode of the diode 22m), and the reference voltage for fault detection Vref2. Then, the comparator for fault detection 51 compares the sense emitter voltage with the reference voltage for fault detection Vref2, and depending on a comparison result, the comparator for fault detection 51 determines whether an abnormal current flows in the transistor 21m. Also, depending on the comparison result, the comparator for fault detection 51 outputs a determination signal, that represents whether an abnormal current flows in the transistor 21m, to the drive circuit 10. Specifically, if determining that an abnormal current does not flow in the transistor 21m, the comparator for fault detection 51 outputs a determination signal (a permission signal), that permits the drive signal to be input into the gate of the transistor 21m, to the drive circuit 10. Also, if determining that an abnormal current flows in the transistor 21m, the comparator for fault detection 51 outputs a determination signal (an inhibition signal), that inhibits at least an on signal among the drive signals from being input into the gate of the transistor 21m, to the drive circuit 10. Specific operations will be described later.

The reference voltage for fault detection Vref2 is the reference for comparison with the sense emitter voltage Vse at the comparator for fault detection 51. The reference voltage for fault detection Vref2 (determination method) will be described in detail later.

Next, a method of determining whether an abnormal current flows in the transistor 21m by the comparator for fault detection 51 based on the sense emitter voltage Vse, will be described.

As described with the third embodiment, the sense emitter voltage Vse is Vse=V1 in a case where both the diode 22m and the transistor 21m do not conduct electricity. Also, the sense emitter voltage Vse is Vse=Von+VFs in a case where the transistor 21m conducts electricity normally (a normal current flows in the transistor 21m). Also, the sense emitter voltage Vse is Vse=−VFm+VFs in a case where the diode 22m conducts electricity.

Note that if an abnormal current, such as an overcurrent due to a short circuit, flows in the transistor 21m, the voltage between the collector and the emitter of the transistor 21m takes a value that is greater than the on voltage Von between the collector and the emitter during normal conduction of electricity. Therefore, by determining the reference voltage for fault detection Vref2 to satisfy Vref2>Von+VFs, the comparator for fault detection 51 can determine whether an abnormal current flows in the transistor 21m.

Next, the output restriction of the drive signal based on a fault the determination signal from the comparator for fault detection 51, will be described.

As described above, if determining that an abnormal current does not flow in the transistor 21m, the comparator for fault detection 51 outputs a determination signal (a permission signal), that permits the drive signal to be input into the gate of the transistor 21m, to the drive circuit 10. Also, if determining that an abnormal current flows in the transistor 21m, the comparator for fault detection 51 outputs a determination signal (an inhibition signal), that inhibits at least an on signal of the drive signal from being input into the gate of the transistor 21m, to the drive circuit 10.

In response to receiving a permission signal as the determination signal from the comparator 50, and receiving a permission signal as the determination signal from the comparator for fault detection 51, the drive circuit 10 outputs a drive signal based on a control signal from the control apparatus, to the gate of the transistor 21m. Also, in response to receiving an inhibition signal as the determination signal from the comparator 50, and/or receiving an inhibition signal as the determination signal from the comparator for fault detection 51, the drive circuit 10 restricts outputting the drive signal. For example, the drive circuit 10 may restrict outputting both an on signal (a high signal) to turn on the transistor 21m, and an off signal (a low signal) to turn off, or may restrict outputting an on signal (a high signal) to turn on the transistor 21m. Thus, in a case where the diode 22m conducts electricity, the transistor 21m is not turned on, and hence, the forward-directional loss of the diode 22m by gate interference can be reduced. In addition, if an abnormal current flows in the transistor 21m, the transistor 21*m* is turned off, and hence, it is possible to prevent the transistor 21*m* from being damaged by the abnormal current.

Note that in the embodiment, although the comparator for fault detection 51 is added to detect an abnormal current of the transistor 21*m* in the semiconductor device 1 according to the third embodiment, the same comparator for fault detection may be added similarly in the semiconductor device 1 according to the first and second embodiments.

For example, when adding the comparator for fault detection in the first embodiment, the comparator for fault detection may be configured to compare the voltage between both terminals of the sense resistor 30 in the first embodiment, with the reference voltage for fault detection Vref2. This is the same for the second embodiment. In this case, as described with the first embodiment, the voltage Vs between both terminals of the sense resistor 30 is Vs=(I1+Is)×Rs in a case where the transistor 21*m* conducts electricity normally. If an abnormal current such as an overcurrent flows in the transistor 21*m*, the current Is increases that flows from the emitter of the sense transistor 21*s* to the sense resistor. Therefore, the reference voltage for fault detection Vref2 may be determined to satisfy Vref2>(I1+Is)×Rs. Thus, the comparator for fault detection can determine whether an abnormal current flows in the transistor 21*m*. Note that the determination signal output from the comparator for fault detection to the drive circuit 10 in the first embodiment, and the operations of the drive circuit 10 may be the same as in the present embodiment. Thus, it is possible to prevent the transistor 21*m* from being damaged by the abnormal current as in the present embodiment.

The embodiments have been described in detail as above. Note that the present invention is not limited to the above embodiments, but various modifications and improvements can be made within the scope of the present invention.

The present application is based on Japanese Priority Application No. 2013-227680, filed on Oct. 31, 2013, the entire contents of which are hereby incorporated by reference.

DESCRIPTION OF REFERENCE SYMBOLS 1 semiconductor device
10 drive circuit
20 diode built-in transistor
21 transistor part
21*s* sense transistor
22 diode part
22*m* diode
22*s* sense diode
25*c* collector terminal
25*e* emitter terminal
30 sense resistor (voltage generation part)
40 current source (voltage generation part)
45 pull-up resistor (voltage generation part)
50 comparator (determination part)
51 comparator for fault detection (determination part)
Vref1 reference voltage
Vref2 reference voltage for fault. detection

The invention claimed is:

1. A power conversion device, comprising:
a diode built-in transistor configured to include
  a transistor configured to be driven by a drive signal input into a gate,
  a diode configured to be connected in parallel with the transistor, and to have a forward direction from an emitter to a collector of the transistor, and
  a sense diode configured to detect a current flowing in the diode, and to have a cathode connected with the collector of the transistor;
a voltage generation part configured to generate, in a case where the diode does not conduct electricity, a voltage between an anode of the diode and an anode of the sense diode, the voltage having a predetermined or greater difference with respect to a case where the diode conducts electricity, wherein the voltage generation part includes
  a sense resistor configured to be provided between the anode of the sense diode and the anode of the diode, and
  a current supplying part configured to be directly connected with the anode of the sense diode and the sense resistor, and to supply a current to the sense diode in the case where the diode conducts electricity, and supplying a current to the sense resistor in the case where the diode does not conduct electricity; and
a determination part configured to determine whether the diode conducts electricity, based on the voltage between the anode of the diode and the anode of the sense diode.

2. The power conversion device as claimed in claim 1, wherein the current supplying part is configured to be connected with the anode of the sense diode, and supply a current to make the sense diode conduct electricity in a case where the transistor conducts electricity.

3. The power conversion device as claimed in claim 1, wherein the current supplying part is a current source or a pull-up resistor.

4. The power conversion device as claimed in claim 1, wherein the determination part includes a first reference voltage for determining whether the diode conducts electricity, the first reference voltage being greater than a voltage of the anode of the sense diode with respect to the anode of the diode in the case where the diode conducts electricity, and less than a voltage of the anode of the sense diode with respect to the anode of the diode in a case where the transistor conducts electricity normally,
wherein the determination part determines that the diode conducts electricity, in response to the voltage of the anode of the sense diode with respect to the anode of the diode, being less than the first reference voltage.

5. The power conversion device as claimed in claim 1, wherein the determination part inhibits input of at least an on signal in the drive signal when determining that the diode conducts electricity.

6. The power conversion device as claimed in claim 1, wherein the determination part determines whether an abnormal current flows in the transistor, based on the voltage between the anode of the diode and the anode of the sense diode, and when determining that the abnormal current flows in the transistor, inhibits input of at least an on signal in the drive signal.

7. The power conversion device as claimed in claim 6, wherein the determination part includes a second reference voltage for determining whether an abnormal current flows in the transistor, the second reference voltage being greater than a voltage of the anode of the sense diode with respect to the anode of the diode in a case where the transistor conducts electricity normally,
wherein the determination part determines that the abnormal current flows in the transistor, in response to the voltage of the anode of the sense diode with respect to the anode of the diode being greater than the second reference voltage.

* * * * *